(12) United States Patent
Miaw

(10) Patent No.: US 6,614,061 B2
(45) Date of Patent: Sep. 2, 2003

(54) ELECTROSTATIC DISCHARGE-PROTECTION SEMICONDUCTOR DEVICE

(75) Inventor: Jiunn-Way Miaw, Tainan (TW)

(73) Assignee: Windbond Electronics Corp., Hsinchu (TW)

(*) Notice: Subject to any disclaimer, the term of this patent is extended or adjusted under 35 U.S.C. 154(b) by 84 days.

(21) Appl. No.: 09/782,719

(22) Filed: Feb. 13, 2001

(65) Prior Publication Data

US 2002/0042195 A1 Apr. 11, 2002

(51) Int. Cl.[7] .......................... H01L 31/111; H01L 23/62
(52) U.S. Cl. ...................... 257/173; 438/621; 257/174; 257/355; 257/364; 257/362; 361/111; 361/56; 361/91
(58) Field of Search .......................... 438/621; 257/173, 257/174, 355, 361, 362; 361/111, 56, 91

(56) References Cited

U.S. PATENT DOCUMENTS 5,982,600 A * 11/1999 Cheng ........................ 361/111
6,060,752 A * 5/2000 Williams ..................... 257/355
6,365,937 B1 * 4/2002 Porter et al. ................. 257/355
6,407,414 B1 * 6/2002 Yu .............................. 257/173

\* cited by examiner

*Primary Examiner*—Hoai Ho
*Assistant Examiner*—Reneé R Berry
(74) *Attorney, Agent, or Firm*—Ladas & Parry

(57) ABSTRACT

The present invention provides an electrostatic discharge-protection device located between a pad and a specific voltage point. The electrostatic discharge-protection device has a P-type substrate. Then a first N-type well, a first P-type doped region, and a first N-type doped region, are formed on the P-type substrate, wherein the first P-type doped region and the first N-type doped region are coupled to the specific voltage point, respectively. A second P-type doped region and a second N-type doped region are formed on the first N-type well and are coupled to the pad, respectively. Moreover, a third N-type doped region and a fourth N-type doped region are formed on the P-type substrate. The third N-type doped region is coupled to the pad, and a second N-type well is formed between the third N-type doped region and the fourth N-type doped region.

20 Claims, 6 Drawing Sheets

ELECTROSTATIC DISCHARGE-PROTECTION SEMICONDUCTOR DEVICE

BACKGROUND OF THE INVENTION

1. Field of the Invention

The present invention relates in general to a semiconductor device. In particular, the present invention relates to an electrostatic discharge-protection semiconductor device to prevent the device comprising field-oxide devices and silicon-controlled rectifiers (SCR) from damage.

2. Description of the Related Art

Electrostatic discharges, ESD hereinafter, is a common phenomenon that occurs during the handling of semiconductor integrated circuit, IC hereinafter, devices. Electrostatic charges may accumulate and cause potentially destructive effects on an IC device. ESD stressing typically can occur during a testing phase of IC fabrication, during installing of the IC onto a circuit board, as well as during use of equipment into which the IC has been installed. Damage to a signal IC due to poor ESD protection in an electronic device can partially or sometimes completely disrupt its operation.

There are several ESD stress models based on the reproduction of typical discharge pulses to which the IC may be exposed during manufacturing or handling. Three standard models, known as the Human Body Model (HBM), Machine Model (MM), and Charged Device Model (CDM) have been proposed. The Human Body Model is set forth in U.S. Military Standard MIL-STD-883, Method 3015.6. The military standard models the electrostatic stress produced on an IC device when a human carrying an electrostatic charge touches the lead pins of the IC device. The machine model is set forth in Industry Standard EIAJ-IC-121, which describes the electrostatic stress produced on an IC device when a machine carrying electric charges contacts the lead pins of the IC device. The charged device model describes the ESD current generated when an IC already carrying electric charges is grounded while being handled.

Refer to FIG. 1. FIG. 1 shows the top view of the traditional structure of an electrostatic discharge-protection semiconductor device.

As shown in FIG. 1, the traditional anti-electrostatic semiconductor device comprises a P-type substrate 11 comprising an N-type well 12. The P-type substrate 11 further comprises a P-type doped region 13 and an N-type doped region 14 which are connected to a specific voltage point 18, wherein the specific voltage point 18 supplies the ground voltage or the Vss voltage. In the N-type well 12, there is a P-type doped region 15 and an N-type doped region 16, which are connected to a pad 19, respectively. Moreover, there is an N-type doped region 17 connected to the pad 19 on the P-type substrate 11.

Refer to FIG. 2, FIG. 2 shows a cross-sectional view along the line A–A' in FIG. 1. A PNP bipolar junction transistor is composed of the P-type doped region 15, the N-type well 12 and the P-type substrate 11, which act as the emitter, the base, and the collector of the PNP bipolar junction transistor, respectively. In addition, An NPN bipolar junction transistor is composed of the N-type well 12, the P-type substrate 11, and the N-type doped region 14, which are used as the collector, the base, and the emitter of the NPN bipolar junction transistor, respectively. The N-type doped region 14 and the P-type doped region 15 are connected to the pad 19, and the N-type region 14 and the P-type region 13 are connected to Vss 18. Therefore, the PNP bipolar junction transistor and the NPN bipolar junction transistor are combined to form a silicon-controlled rectifier, SCR hereinafter.

Refer to FIG. 3, FIG. 3 shows a cross-sectional view along the line B–B' in FIG. 1. In FIG. 3, a field-oxide device is composed of the N-type doped region 17, the P-type substrate 11, and the N-type doped region 14. The N-type doped region 17(collector) is connected to the pad 19 and the N-type doped region 14 (emitter) is connected to the Vss. Further, field-oxide layer of the field-oxide device is made by Local oxidation of silicon technology, LOCOS hereinafter.

FIG. 4 is an equivalent circuit diagram of the semiconductor in FIG. 1. When the voltage difference between the pad 19 and the Vss reaches to a specific degree caused by the charge accumulating, at this time, the field-oxide device 42 will turn on then provide enough current to cause the silicon-controlled rectifier 41 turn on immediately. Hence, the turn on voltage of the silicon-controlled rectifier 41 will decrease. Therefore, the combining of the silicon-controlled rectifier 41 and the field-oxide device 42 will be lower than the turn on voltage of the silicon-controlled rectifier 41 than using the silicon-controlled rectifier 41 alone. When the silicon-controlled rectifier 41 is turned on, the charge accumulating in the semiconductor device will flow to the ground. Thus, the technology prevents the elements of the semiconductor device from damaging by the electrostatic stress.

Refer to FIG. 3, which shows the appearance of the field-oxide layer 31 in the field-oxide device 42. Because the field-oxide layer 31 is made by the LOCOS, there is a smooth "bird's beak structure" in the field-oxide layer 31. Therefore, the charge accumulating in the N-type doped region 17 will pass through the field-oxide layer 31 easily. However, although the bird's beak structure may ease the flowing of the charges, but the bird's beak structure takes a lot of space and will decrease the integration of the semiconductor structure designs.

Therefore, for solving the problem of wasted space caused by the bird's beak structure, the conventional technology develops a Shallow Trench Isolation method to forming the field-oxide layer 31. The Shallow Trench Isolation method comprises the steps as follows. First, etches a trench on the field-oxide layer 31, then deposits a silicide on the trench directly. Therefore, a field-oxide layer is formed without the bird's beak structure. Hence, the integration of a semiconductor device will increase.

However, although forming the field-oxide layer by the shallow trench isolation method will decrease the size of the field-oxide layer, but it is difficult for the charges to pass through the field-oxide layer by the shallow trench isolation because of the resistance between the field-oxide layer 31 and the N-type doped region. Therefore, when a great deal of electrostatic stress in the semiconductor device, overheating will be generated in the region between the collector of the field-oxide device and the field-oxide layer, which will cause the field-oxide devices to be broken.

SUMMARY OF THE INVENTION

It is therefore an object of the present invention to provide an electrostatic discharge-protection device, which combines the silicon-controlled rectifier and the field-oxide device to make the silicon-controlled rectifier turn on at the lower voltage. Moreover, in order to improve the integration of the semiconductor device, the field-oxide layer of the field-oxide device according to the present invention is formed by the shallow trench isolation method. Then, to prevent the field-oxide device from forming by the shallow trench isolation method and breaking because of the overheating, the present invention provides a well structure in the field-oxide device. It is because the area of the well structure is large, so the well structure has good performance in radiating the heat. Moreover, this well structure with a relatively larger area may prevent the field-oxide device from failing because of the high temperature. When the field-oxide device drives the silicon-controlled rectifier successfully, the element of the semiconductor device will not be broken by the electrostatic stress.

To achieve the above-mentioned object, the present invention provides an electrostatic discharge-protection device located between a pad and a specific voltage point. The electrostatic discharge-protection device has a P-type substrate. Then a first N-type well, a first P-type doped region, and a first N-type doped region, are formed on the P-type substrate, wherein the first P-type doped region and the first N-type doped region are coupled to the specific voltage point, respectively. A second P-type doped region and a second N-type doped region are formed on the first N-type well and are coupled to the pad, respectively. Moreover, a third N-type doped region and a fourth N-type doped region are formed on the P-type substrate. The third N-type doped region is coupled to the pad, and a second N-type well is formed between the third N-type doped region and the fourth N-type doped region.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

Figure 5:
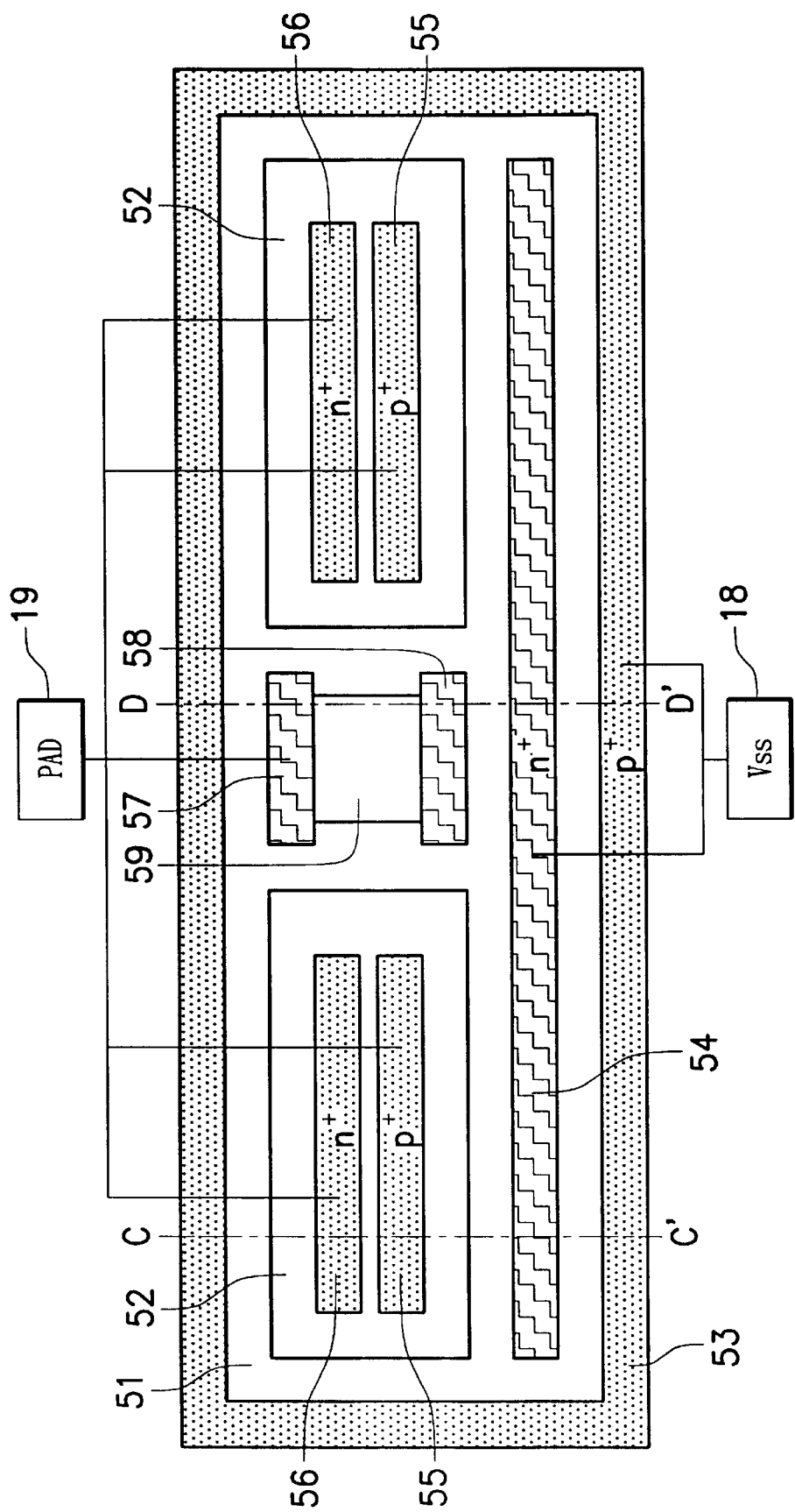
FIG. 5 shows the top view of the structure of an electrostatic discharge-protection semiconductor device according to the present invention.

Refer to FIG. 5, which shows a top view of the structure of an electrostatic discharge-protection semiconductor device according to the present invention.

As shown in FIG. 5, the anti-electrostatic semiconductor device according to the embodiment of the present invention comprises a P-type substrate 51 comprising an N-type well 52. The P-type substrate 51 further comprises a P-type doped region 53 and an N-type doped region 54 which are connected to a specific voltage point 18, wherein the specific voltage point 18 supplies the ground voltage or the Vss voltage. In the N-type well 52, there is a P-type doped region 55 and an N-type doped region 56, which are connected to a pad 19, respectively. Here, the pad 19 is connected to a positive voltage end.

Moreover, there is an N-type doped region 57 connected to the pad 19 in the P-type substrate 51. Further, the P-type substrate comprises an N-type doped region 58, and there is an N-type well 59 located between the N-type doped region 57 and the N-type doped region 58. Wherein the concentration of dopant in the P-type doped region 55 and the second P-type doped region 53 is higher than the concentration of dopant in the P-type substrate 51 and the concentration of dopant in the N-type doped region 54, the N-type doped region 56, the N-type doped region 57, and the N-type doped region 58 are higher in concentration than that of the dopant in the first N-type well.

Figure 1:
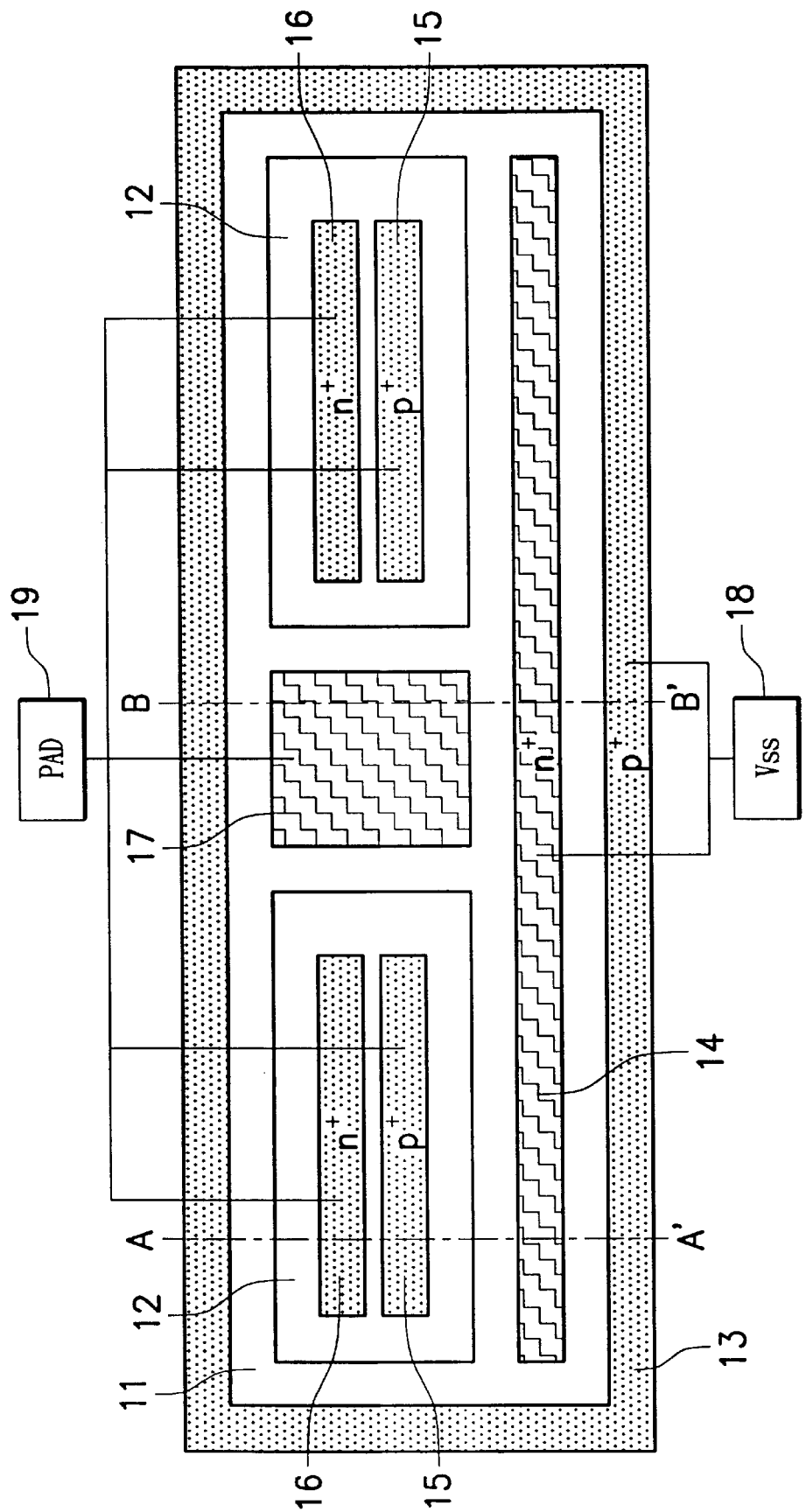
FIG. 1 shows the top view of the traditional structure of an electrostatic discharge-protection semiconductor device.
Figure 2:
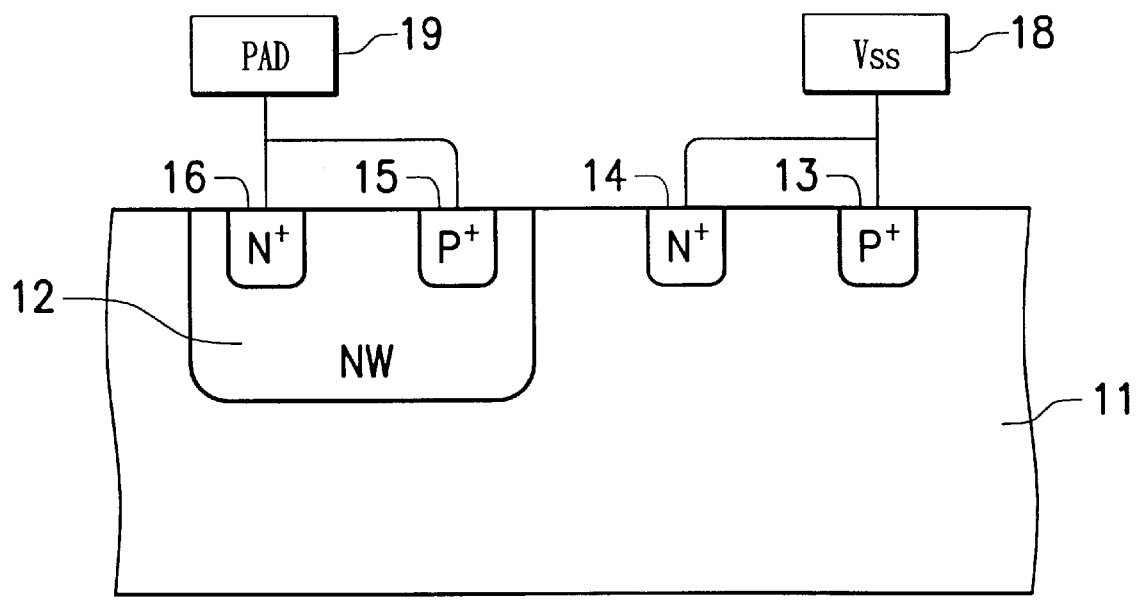
FIG. 2 shows a cross-sectional view along the line A–A' in FIG. 1.
Figure 3:
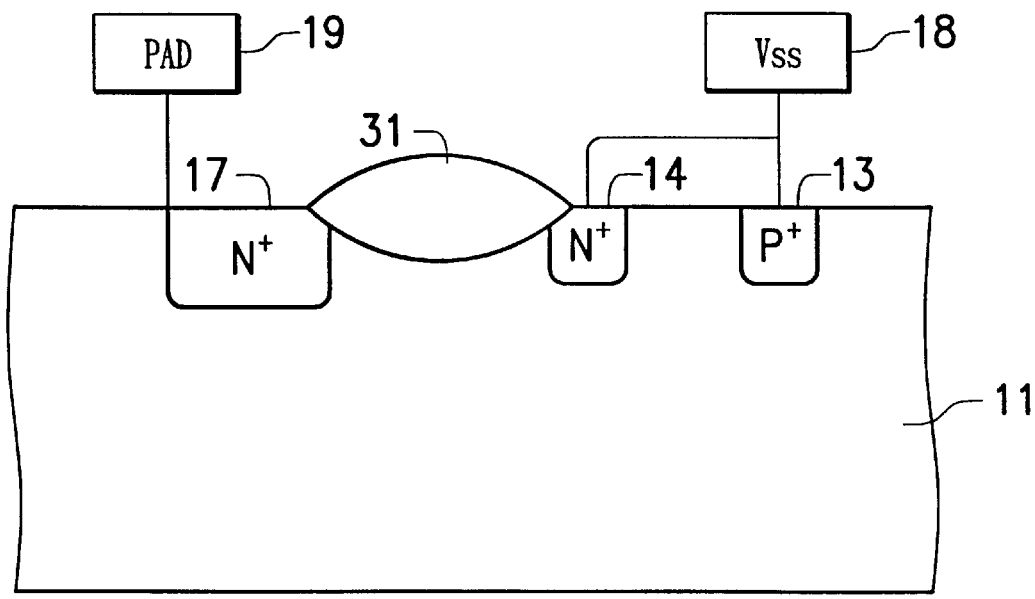
FIG. 3 shows a cross-sectional view along the line B–B' in FIG. 1.
Figure 4:
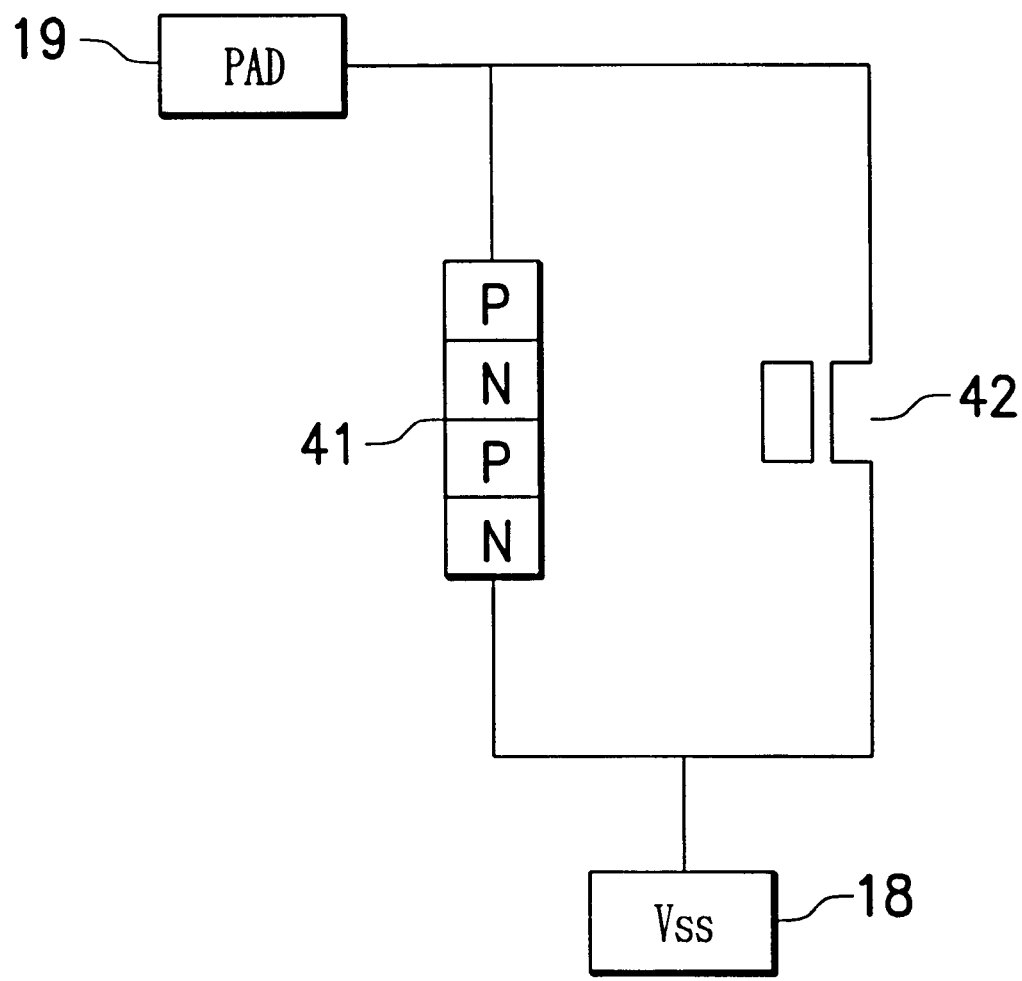
FIG. 4 is an equivalent circuit diagram of the semiconductor in FIG. 1.
Figure 6:
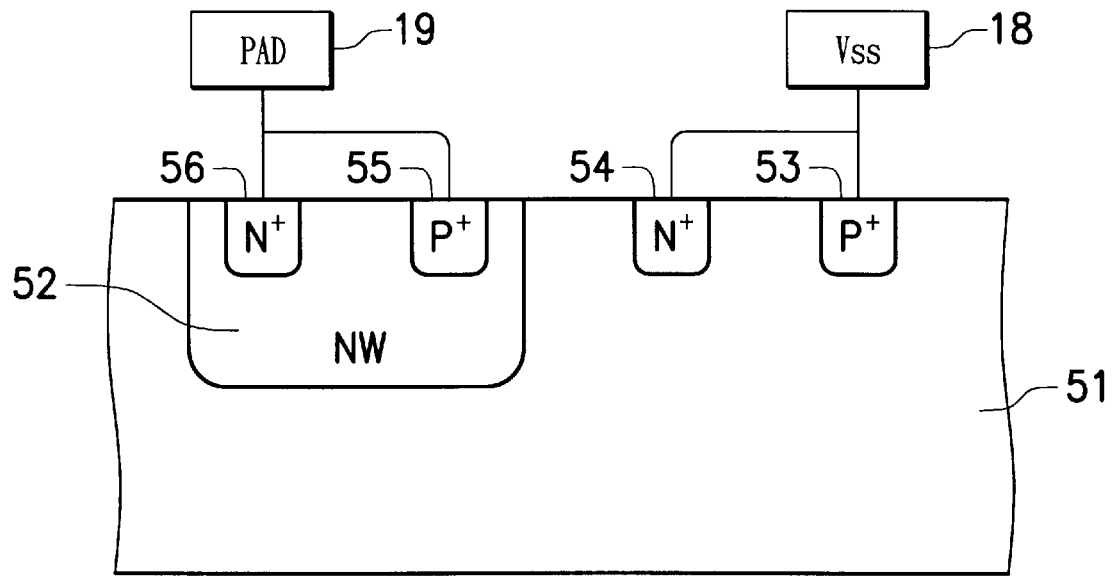
FIG. 6 shows a cross-sectional view along the line C–C' in FIG. 5.

Refer to FIG. 6, which shows a cross-sectional view along the line C–C' in FIG. 5. Here, the cross-sectional view along the line C–C' in FIG. 5 is the same with the cross-sectional view along the line A–A' in FIG. 1.

A PNP bipolar junction transistor is composed of the P-type doped region 55, the N-type well 52 and the P-type substrate 51, which become the emitter, the base, and the collector of the PNP bipolar junction transistor, respectively. In addition, An NPN bipolar junction transistor is composed of the N-type well 52, the P-type substrate 51, and the N-type doped region 54, which are used as the collector, the base, and the emitter of the NPN bipolar junction transistor, respectively. The N-type doped region 56 and the P-type doped region 55 are connected to the pad 19, and the N-type region 54 and the P-type region 53 are connected to Vss 18. Therefore, the PNP bipolar junction transistor and the NPN bipolar junction transistor are combined to form a SCR.

Figure 7:
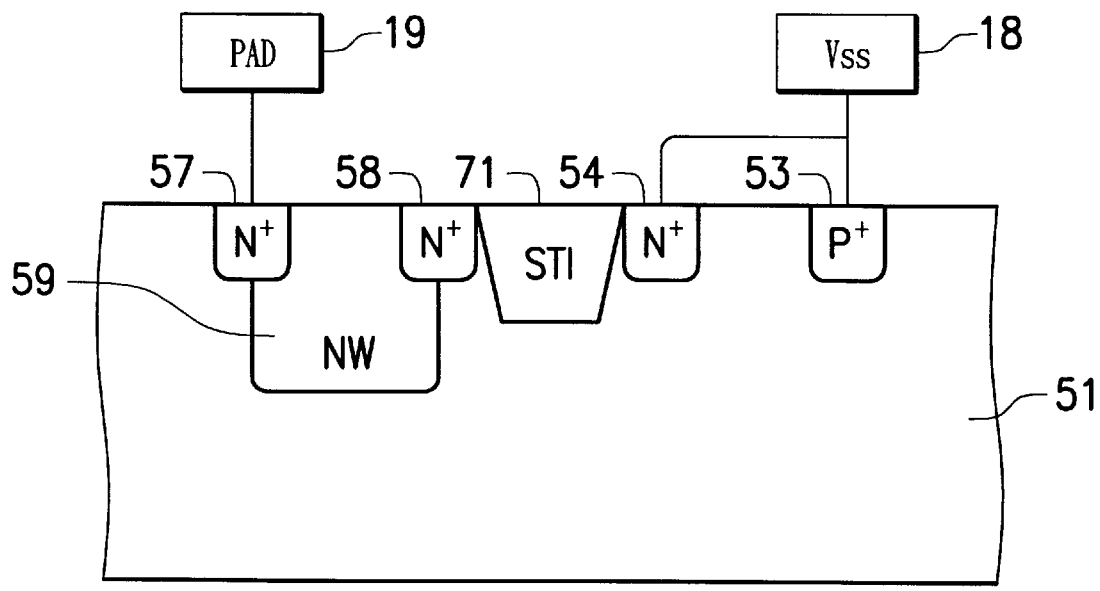
FIG. 7 shows a cross-sectional view along the line D–D' in FIG. 5.

Refer to FIG. 7, which shows a cross-sectional view along the line D–D' in FIG. 5. In FIG. 7, a field-oxide device is composed of the N-type doped region 58, the P-type substrate 51, and the N-type doped region 54. Moreover, the region between the N-type doped region 57 and the N-type doped region 48 comprises a resistor caused by the N-type well 59 (not shown). The N-type doped region 58 (collector) is connected to the pad 19 through the resistor in the N-type well 59 and the N-type doped region 54 (emitter) is connected to the Vss. Further, field-oxide layer 71 is made by shallow trench isolation method.

Figure 8:
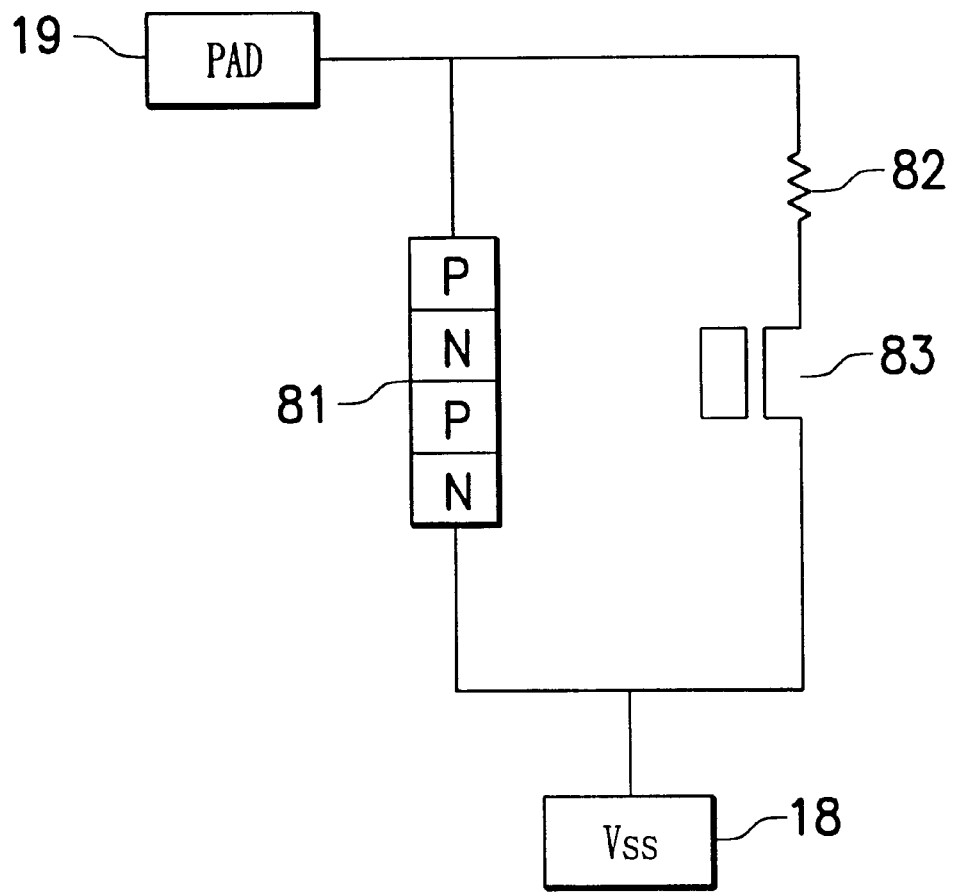
FIG. 8 is an equivalent circuit diagram of the semiconductor in FIG. 5.

Refer to FIG. 8, which is an equivalent circuit diagram of the semiconductor in FIG. 5. Wherein the resistor 82 is generated by adding the N-type well 59. When the voltage difference between the pad 19 and the Vss reaches to a specific degree caused by the charge accumulating, at this time, the field-oxide device 83 will turn on and then provide enough current to cause the silicon-controlled rectifier 81 to turn on immediately. Hence, the turn on voltage of the silicon-controlled rectifier 81 will decrease. When the silicon-controlled rectifier 81 is turned on, the charge accumulating in the semiconductor device will flow to the ground. Thus, the elements of the semiconductor device will prevented from damaging by the electrostatic stress.

According to this embodiment, a well structure is added to the region between the pad and the collector of the field-oxide device. It is because that the area of the N-type well is relatively large, this characteristic of the N-type well will enhance the effect of heat radiating. Moreover, the resistors of the well enables the uniform distribution of the heat generated by the charge flowing in the well structure, which prevents over-heating in the small region and damage from being caused. Further the well having the relatively large area enhances the ability to withstand the heat, which prevents damage to the conventional field-oxide device caused by the high temperature. When the field-oxide device drives the SCR successfully, the element of the semiconductor device will not be broken by the electrostatic stress.

The effect of present embodiment is tested for the HBM and MM method. The results of the test are described as below. When using the HBM and MM to test the conventional semiconductor devices in the prior art (FIG. 1), the result of the testing is 2.28 KV and 257V, respectively. When using the HBM and MM to test the semiconductor devices according to the embodiment of the present invention, the result of the testing is 6.0 KV and 450V, respectively. Therefore, the arrangement of the present invention surely improves the anti-electrostatic ability of the semiconductor devices.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An electrostatic discharge-protection device located between a pad and a specific voltage point, comprising:
    a first-type substrate;
    a first second-type well formed on the first-type substrate;
    a first first-type doped region and a first second-type doped region formed on the first-type substrate and coupled to the specific voltage point, respectively;
    a second first-type doped region and a second second-type doped region formed on the first second-type well and coupled to the pad, respectively;
    a third second-type doped region formed on the first-type substrate and coupled to the pad;
    a fourth second-type doped region formed on the first-type substrate; and
    a second second-type well formed between the third second-type doped region and the fourth second-type doped region.

2. The electrostatic discharge-protection device as claimed in claim 1, further comprising an oxide layer formed between the first second-type doped region and the fourth second-type doped region.

3. The electrostatic discharge-protection device as claimed in claim 2, wherein the first-type doped region is a P-type doped region and the second-type doped region is a N-type doped region.

4. The electrostatic discharge-protection device as claimed in claim 2, wherein the first-type doped region is a N-type doped region and the second-type doped region is a P-type doped region.

5. The electrostatic discharge-protection device as claimed in claim 4, wherein the concentration of dopant in the first first-type doped region and the second first-type doped region are higher than the concentration of dopant in the first-type substrate.

6. The electrostatic discharge-protection device as claimed in claim 5, wherein the concentration of dopant in the first second-type doped region, the second second-type doped region, the third second-type doped region, and the fourth second-type doped region are higher than the concentration of dopant in the first second-type well.

7. The electrostatic discharge-protection device as claimed in claim 5, wherein the pad is coupled to a positive voltage end.

8. The electrostatic discharge-protection device as claimed in claim 7, wherein the specific voltage point is grounded.

9. A electrostatic discharge-protection device located between a pad and a specific voltage point, comprising:
    a P-type substrate;
    a first N-type well formed on the P-type substrate;
    a first P-type doped region and a first N-type doped region formed on the P-type substrate and coupled to the specific voltage point, respectively;
    a second P-type doped region and a second N-type doped region formed on the first N-type well and coupled to the pad, respectively;
    a third N-type doped region formed on the P-type substrate and coupled to the pad;
    a fourth N-type doped region formed on the P-type substrate; and
    a second N-type well formed between the third N-type doped region and the fourth N-type doped region.

10. The electrostatic discharge-protection device as claimed in claim 9, further comprising an oxide layer formed between the first N-type doped region and the fourth N-type doped region.

11. The electrostatic discharge-protection device as claimed in claim 10, wherein the concentration of dopant in the first P-type doped region and the second P-type doped region are higher than the concentration of dopant in the P-type substrate.

12. The electrostatic discharge-protection device as claimed in claim 10, wherein the concentration of dopant in the first N-type doped region, the second N-type doped region, the third N-type doped region, and the fourth N-type doped region are higher than the concentration of dopant in the first N-type well.

13. The electrostatic discharge-protection device as claimed in claim 12, wherein the pad is coupled to a positive voltage end.

14. The electrostatic discharge-protection device as claimed in claim 7, wherein the specific voltage point is grounded.

15. A electrostatic discharge-protection device located between a pad and a specific voltage point, comprising:
    a P-type substrate;
    a first N-type well formed on the P-type substrate;
    a first P-type doped region and a first N-type doped region formed on the P-type substrate and coupled to the specific voltage point, respectively;
    a second P-type doped region and a second N-type doped region formed on the first N-type well and coupled to the pad, respectively;
    a third N-type doped region formed on the P-type substrate and coupled to the pad;
    a fourth N-type doped region formed on the P-type substrate; and
    a heat dissipating device coupled between the third N-type doped region and the fourth N-type doped region.

16. The electrostatic discharge-protection device as claimed in claim 15, further comprising an oxide layer formed between the first N-type doped region and the fourth N-type doped region.

17. The electrostatic discharge-protection device as claimed in claim 16, wherein the concentration of dopant in the first P-type doped region and the second P-type doped region is higher than the concentration of dopant in the P-type substrate.

18. The electrostatic discharge-protection device as claimed in claim 16, wherein the concentration of dopant in the first N-type doped region, the second N-type doped region, the third N-type doped region, and the fourth N-type doped region is higher than the concentration of dopant in the first N-type well.

19. The electrostatic discharge-protection device as claimed in claim 18, wherein the pad is coupled to a positive voltage end.

20. The electrostatic discharge-protection device as claimed in claim 19, wherein the specific voltage point is grounded.

* * * * *